United States Patent [19]

Arikado

[11] Patent Number: 5,443,200
[45] Date of Patent: Aug. 22, 1995

[54] BONDING APPARATUS AND BONDING METHOD

[75] Inventor: Kazuo Arikado, Fukuoka, Japan

[73] Assignee: Matsushita Electric Industrial Co., Ltd., Osaka, Japan

[21] Appl. No.: 216,402

[22] Filed: Mar. 23, 1994

[30] Foreign Application Priority Data

Oct. 13, 1993 [JP] Japan .................... 5-255756
Nov. 12, 1993 [JP] Japan .................... 5-283449

[51] Int. Cl.⁶ ............................................ B23K 20/00
[52] U.S. Cl. ................................. 228/102; 228/4.5; 228/6.2; 228/8
[58] Field of Search ............... 228/102, 103, 4.5, 6.2, 228/8

[56] References Cited

U.S. PATENT DOCUMENTS

| 4,444,349 | 4/1984 | Bilane et al. | 228/102 |
| 4,696,425 | 9/1987 | Landes | 228/4.5 |
| 5,011,061 | 4/1991 | Funatsu | 228/8 |

FOREIGN PATENT DOCUMENTS

| 55-141736 | 11/1980 | Japan | 228/102 |
| 5-11664B2 | 8/1988 | Japan | |
| 63-186436 | 8/1988 | Japan | 228/4.5 |
| 5-854B2 | 6/1989 | Japan | |

Primary Examiner—Mark Rosenbaum
Assistant Examiner—Jeffrey T. Knapp
Attorney, Agent, or Firm—Stevens, Davis, Miller & Mosher

[57] ABSTRACT

An apparatus for bonding such as wire bonding or inner lead bonding comprises a holding unit for holding an object to be bonded, a supporting unit for mounting thereto the holding unit, a driving unit for moving upwardly and downwardly the supporting unit, and a drive control circuit for controlling the driving unit in accordance with stored information about operations of the supporting member. The bonding apparatus includes a control unit for changing a gain characteristic of the drive control circuit from a high gain characteristic to a low gain characteristic while the holding unit is caused to descend before this holding unit is contacted onto a bonding surface.

17 Claims, 7 Drawing Sheets

BONDING APPARATUS AND BONDING METHOD

BACKGROUND OF THE INVENTION

The present invention relates to a bonding apparatus and bonding method, suitable to wire bonding and inner lead bonding used in assembling electronics parts or components.

In assembling stages of electronic parts or components, either wire bonding is performed to connect electrodes of a semiconductor chip with electrodes (or terminals) of a substrate by way of very narrow wire, or inner lead bonding is carried out to join very narrow leads formed on a carrier tape with electrodes (or terminals) of a semiconductor chip.

The conventional wire bonding will now be described as one of these prior art bonding techniques.

FIG. 6 is a schematic block diagram of a control system of the conventional wire bonding apparatus, and FIG. 7 is a timing chart for representing the conventional bonding method.

In FIG. 7, reference numeral 1 denotes a horn functioning as a bonding arm. A hollow capillary tool 2 is held by one end portion of this horn 1. A very narrow wire 3 is penetrated through this hollow capillary tool 2. The horn 1 is swung along upper and lower directions by means of a motor 1 (not shown).

In FIG. 6, reference numeral 4 denotes a calculator for calculating deviation "E" between an operation pattern signal "A" transferred from a control unit 5 and a feedback signal "B" transferred from a position detector (not shown) for detecting a rotation amount of the horn 1.

This operation pattern "A" is constructed of a plurality of pulse signals. The quantity of this pulse signal indicates the rotation amount of the horn 1, namely the transport distance of the capillary tool. The transport (travel) distance of the capillary is substantially proportional to the number of pulse signal. Also, the frequency of the pulse signal is proportional to the moving velocity (speed) of the capillary tube 2. The higher, the frequency of the pulse signal becomes, the faster the moving speed of the capillary tool 2 becomes. Conversely, when the frequency of the pulse signal is lowered, the moving speed of the capillary tool becomes slow. When the frequency is selected to be constant, the capillary tool 2 is transported at a constant velocity.

Similarly, a feedback signal "B" to the calculator 4 is arranged by pulse signals. Every time the capillary tool 2 is transported over a predetermined distance, the pulse signals are produced. As a consequence, the distance over which the capillary tool is traveled may be calculated by counting the quantity of pulse signals.

Reference numeral 6 indicates a drive circuit for driving a motor under such a control method selected from a "position control method", or a "torque control method". In case that the motor is driven under the position control method, a drive current I determined in accordance with the deviation "E" is supplied to the motor from this drive circuit. In other words, the motor is driven along such a direction that this deviation "E" becomes 0. On the other hand, the motor is driven by a drive current I defined in correspondence with a bonding load in response to a pressure applying instruction signal D in the torque control method. The changing operation of these control methods in the drive circuit 6 is carried out in response to a control method changing signal "C".

FIG. 8 represents a relationship between the deviation and the drive current in the drive circuit of the conventional bonding apparatus. The drive circuit 6 increases the value of the drive current "I" in accordance with the absolute value of the deviation "E".

A change in the drive currents "I" with respect to the deviation "E", namely an inclination degree of the curve shown in the relation diagram of FIG. 8, is varied in correspondence with the magnitude of the gain characteristic gain "K" of the drive circuit 6. In other words, when the gain characteristic "K" becomes high, an inclination of this curve becomes steep. Conversely, when the gain characteristic "K" becomes low, an inclination of this curve becomes gentle. Normally, the value of this gain characteristic "K" is set in such a range that the operation of the bonding apparatus becomes stable.

Very recently, there is a trend to set this gain characteristic "K" to a high value by either increasing the bonding speeds of the wire bonding apparatus, or by introducing the wire loop control function (function to control up/down movements of the horn so as to make the shape of the wire loop in a desired shape).

Referring now to FIG. 7, the conventional wire bonding method will be explained.

In FIG. 7, symbol "R" indicates a trail of operation positions of the lower end portion of the capillary tool 2. It should be understood that although FIG. 7 shows only the first bonding process for performing wire bonding to the electrodes or terminals of the semiconductor chip, since the second bonding process for executing wire bonding to electrodes or terminals of the substrate, this second bonding process is omitted.

First, after the ball 3a has been formed on the upper edge portion of the wire 3, the capillary tool 2 is moved at high speed "V1" downwardly toward the bonding surface S (surface of electrode of semiconductor chip, or surface of electrode of substrate). When the capillary tool 2 has reached a predetermined height SL (search level) from the bonding surface S, the transporting speed is reduced to the low speed "V2".

Subsequently, when a contacting detecting means detects such a fact that the ball 3a is in contact with the bonding surface "S" at the time instant T3, the transmission of the operation pattern signal A is interrupted from the control unit 5, and also the control method changing signal "C" is sent to the drive circuit 6 so as to change the control method from the position control method to the torque control. At the same time, the pressure applying instruction signal "D" is delivered to the drive circuit 6, so that the drive current "I" defined in correspondence with a predetermined bonding load is outputted from the drive circuit 6.

Next, during a time period from the time instant T3 to the time instant T4, the ball 3a is depressed by the capillary tool 2 against the bonding surface "S" at a preselected bonding load by way of torque produced from the motor. At the same time, the wire 3 is joined while ultrasonic waves produced from the ultrasonic vibrator mounted on the other edge portion of the horn 1 are applied to the bonding surface "S". Then, after the time instant T4 has elapsed, while the wire 3 is derived, the capillary tool 2 is elevated or lifted at the high speed to be transported toward the electrodes of the substrate, and the second bonding process is carried out, whereby 1 cycle process of the wire bonding operation is completed.

However, although the contacting detecting means detects such a fact that the ball 3a of the wire is in contact with the bonding surface S, actually, there is a time lag of approximately 5 milliseconds until the ball 3a is in contact with the bonding surface S at the time instant T2 and this contact condition is detected by the contact detecting means. As a result, during such a time period from the time instant T2 when the ball 3a is actually in contact with the bonding surface S until the time instant T3 when this contact condition by the ball 3a is detected, the control unit 5 continues to send the operation pattern signal "A" for instructing that the capillary tool is further continuously moved to descend.

Here, since the capillary tool 2 is contacted via the ball 3a onto the bonding plane S at the time instant T2, the movement of the capillary tool 2 is substantially stopped, and the pulse signals of the feedback signal B disappear at the time instant T2.

As a consequence, the deviation "E" is increased by the number of the operation pattern signal A1 which has been transmitted to the calculator 4 during the time interval from the time instant T2 to the time instant T3, as shown in FIG. 7, and the drive current supplied to the motor is also increased. In other words, the ball 3a is depressed against the bonding surface S under excessive force caused by torque produced by the increased drive current I. Accordingly, more great impact loads would be produced in conjunction with the impact loads occurring when the capillary tool 2 is landed and contacted onto the bonding surface S. Thus, according to the above-explained wire bonding method, such a measure has been taken that the speed V2 just before the capillary tool 2 is rounded onto the bonding plane S is further lowered in order not give such a damage that the ball 3a would be deformed and the bonding surface would be deformed. This may disturb such a high-speed bonding operation.

SUMMARY OF THE INVENTION

An object of the present invention is to provide a bonding apparatus and a bonding method, capable of realizing a high-speed wire bonding operation without deteriorating qualities of wire bonding operations.

To achieve the above object, a bonding apparatus according to one aspect of the present invention is equipped with a holding unit for holding a bonding object, a supporting unit for mounting thereto the holding unit, a driving unit for moving upwardly and downwardly the supporting unit, and a drive control circuit for controlling the driving unit in accordance with stored information about operations of the supporting means. Furthermore, the bonding apparatus includes a control unit for changing a gain characteristic of the drive control circuit from a high gain characteristic to a low gain characteristic while the holding unit is caused to descend before this holding unit is contacted to a bonding surface.

DESCRIPTION OF THE PREFERRED EMBODIMENTS

A description will now be made of an embodiment of the present invention with reference to FIGS. 1 to 5.

Figure 1:
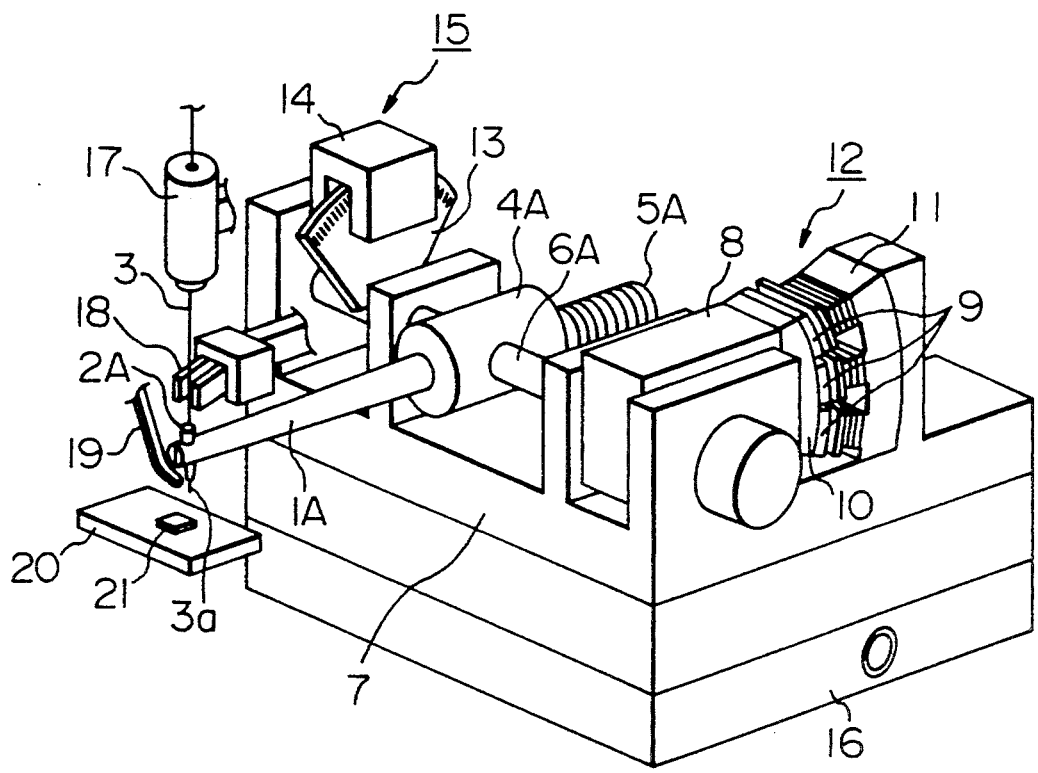
FIG. 1 is a perspective view of a bonding apparatus according to an embodiment of the present invention.

In FIG. 1, reference numeral "2A" shows a capillary tool functioning as a bonding tool, mounted on a tip portion of a horn 1A.

A wire 3 is passed through a hollow or channel formed in this capillary tool 2A.

Reference numeral 4A denotes a holder for holding the horn 1A functioning as a bonding arm, reference numeral 5A shows an ultrasonic vibrator mounted on the rear portion of the horn 1A, and reference numeral 6A represents a rotation shaft extending along the horizontal direction of the holder 4A, and pivotally journaled to a base 7.

Reference numeral 8 is a block connected to the rotation shaft 6A. A plurality of rotary portions 10 equipped with a plurality of permanent magnet 9 are fixed to one end of this block 8. Reference numeral 11 shows a stator portion positioned opposite to the permanent magnet 9, and is fixed to the base 7. In other words, the block 8, rotor portion 10, and stator portion 11 constitute a motor 12 for swinging the horn 1A. Reference numeral 13 is an encoder mounted on the rotation shaft 6A, and reference numeral 14 shows a sensor for sensing a scale of this encoder 13. In other words, both the encoder 13 and the sensor 14 constitute a position sensor 15 for sensing a rotation amount of the horn 1A, namely a change in positions of the capillary tool 2A along a height direction thereof. Reference numeral 16 indicates an XY table for transporting the base 7 in the horizontal plane. Reference numeral 17 is a feeding means for feeding a wire wound on a spool (not shown), reference numeral 18 shows a clamper for clamping the wire 3, and reference numeral 19 denotes a torch rod for forming a ball 3a at the lower end portion of the wire 3 by way of discharging.

Then, a wire bonding apparatus according to an embodiment of the present invention will now be explained with reference to FIG. 2. In this drawing, reference numeral 31 shows a present position detecting means for detecting by counting a present position of the capillary tool 2 in response to a signal outputting by the position detecting means 15. Reference numeral 32 denotes a contact detecting means for detecting such a fact that the capillary tool 2A is contacted to a bonding plane "S", and reference numeral 33 shows a control means for controlling an overall operation of this wire bonding apparatus, and containing a CPU (central processing unit), a memory, and so on.

Symbol "MD" denotes a motor driver for controlling the motor 12 in response to an operation pattern signal "A" transmitted from the control means 33, and includes a calculator 34 and a drive circuit 35. The calculator 34 calculates deviation "E" between the operation pattern signal "A" outputted from the control means 33 and a feedback signal "B" sent from the position detecting means.

This operation pattern signal "A" is constructed of a plurality of pulse signals. The quantity of this pulse signal indicates a rotation amount of the horn 1A, namely a transport distance of the capillary tool. The transport distance of the capillary tool is substantially proportional to the quantity of pulse signals. Also, the frequency of the pulse signals is proportional to the transport velocity of the capillary tool 2. The higher the frequency becomes, the faster the transport velocity of the capillary tool 2 becomes. Conversely, the lower the frequency becomes, the slower the transport velocity. Furthermore, if the frequency would be constant, then the capillary tool 2 is moved at constant velocity.

This operation pattern signal A has been stored in the memory employed within the control means 33.

Similarly, a feedback signal "B" is constructed of pulse signals. Such pulse signals are produced every time the capillary tool 2A is moved over a predetermined distance. Accordingly, it is possible to measure the distance over which the capillary tool is moved by counting the number of this pulse signal.

For the sake of simple explanation, in accordance with this embodiment, it should be understood that the travel distance of the capillary tool 2 per 1 pulse signal of the operation pattern signals "A" is equal to the operation distance of the capillary tool 2 per 1 pulse signal of the feedback signal "B".

Upon transmission of a reset signal "G" from the control means 33, the calculator 34 resets the deviation to zero (0) at this time.

The drive circuit 35 selectively switches the position control method and the torque control method in response to a control method switching signal "C" derived from the control means 33.

Figure 5:
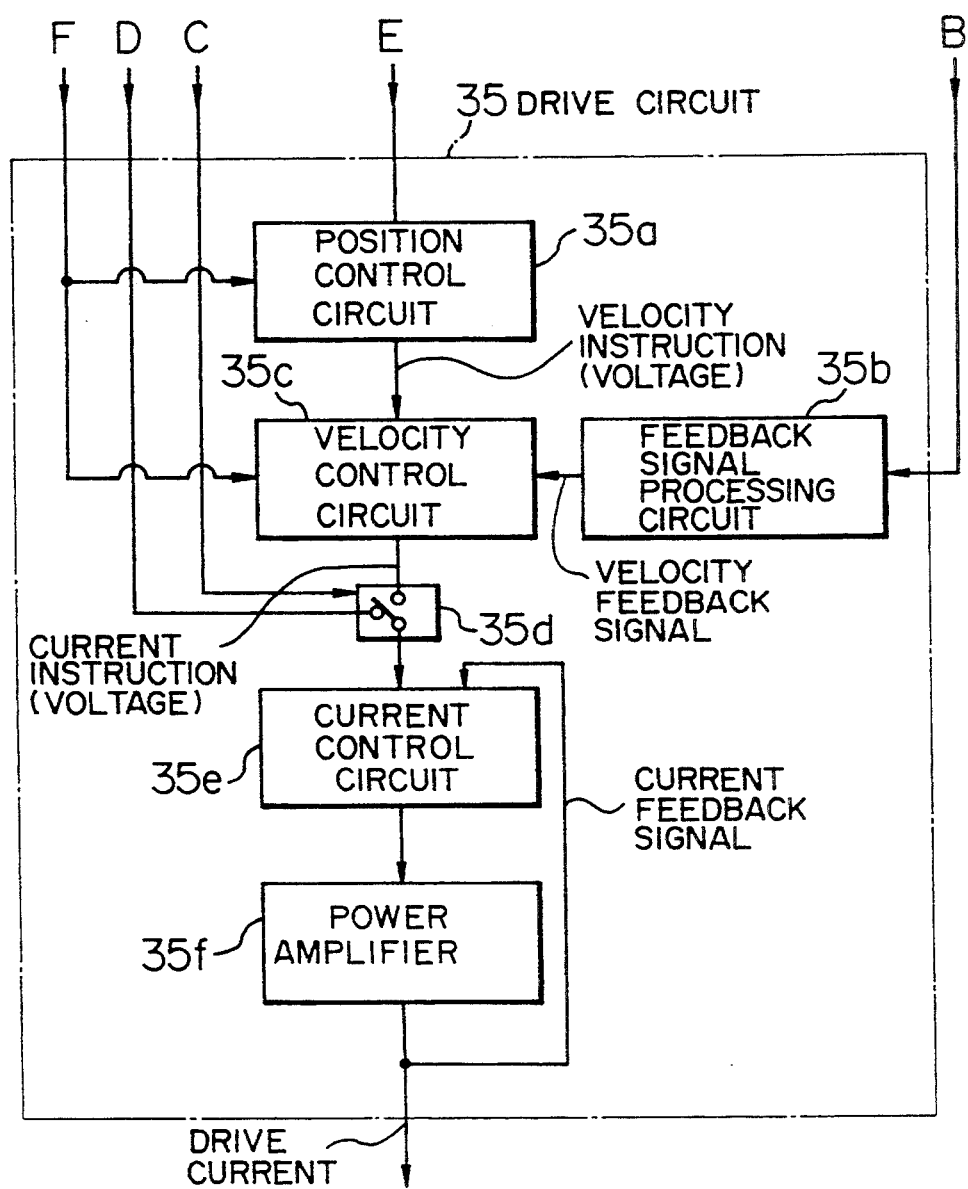
FIG. 5 is a schematic block diagram of the drive circuit of the bonding apparatus according to the embodiment of the present invention.
Figure 6:
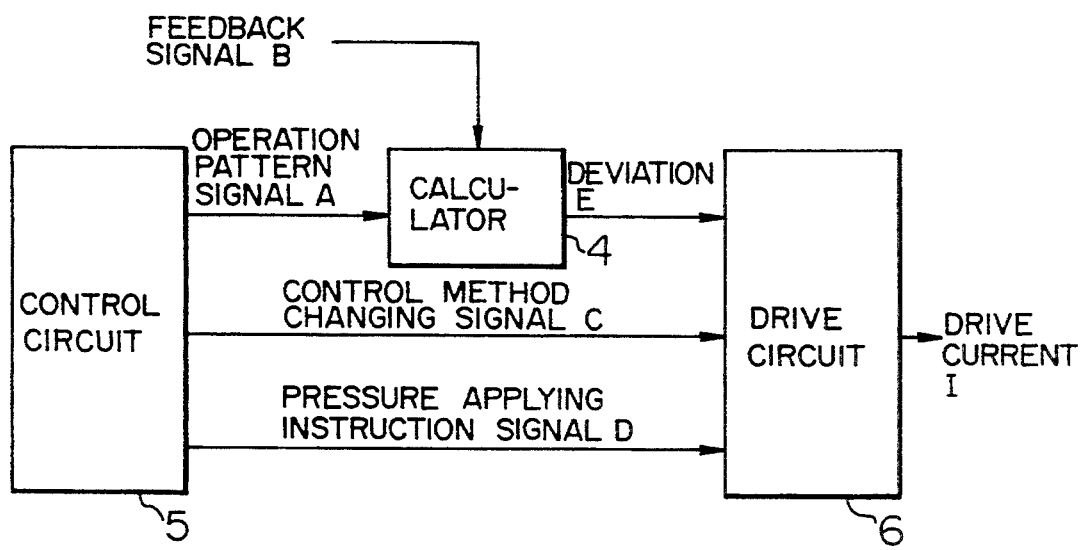
FIG. 6 is a control block diagram of the conventional bonding apparatus.
Figure 7:
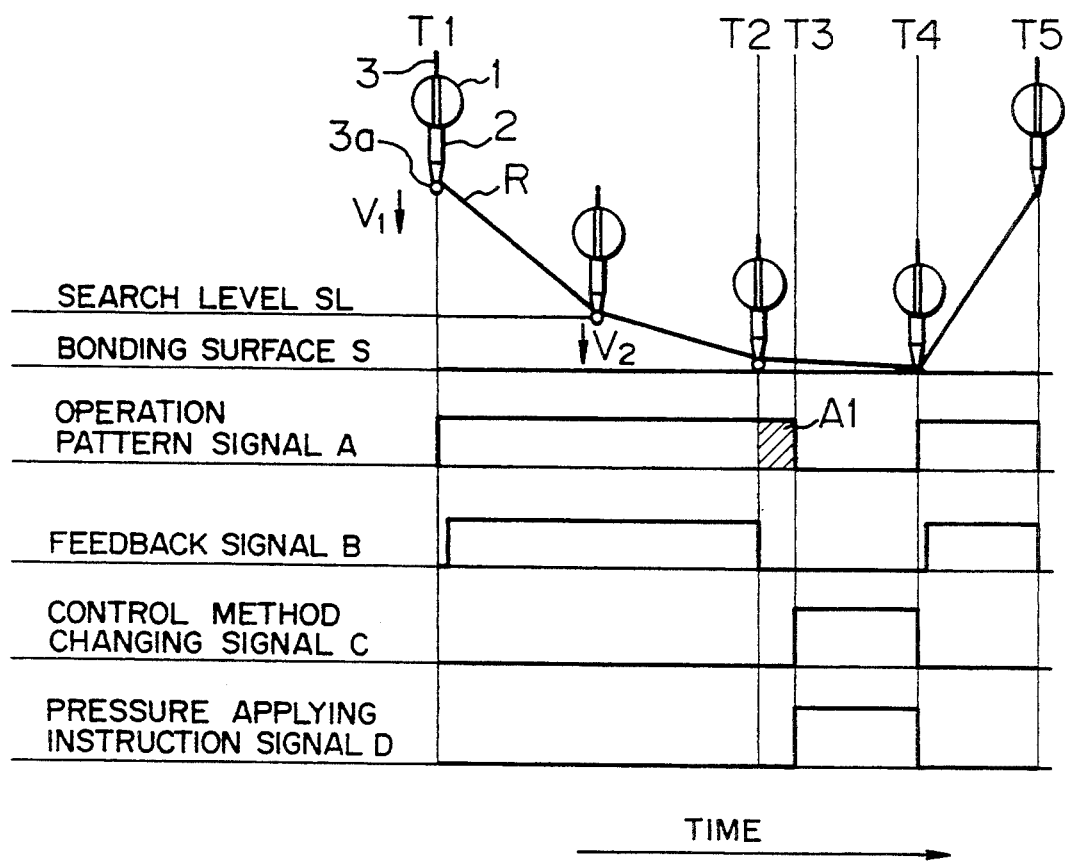
FIG. 7 is a timing chart for showing the conventional bonding method.
Figure 8:
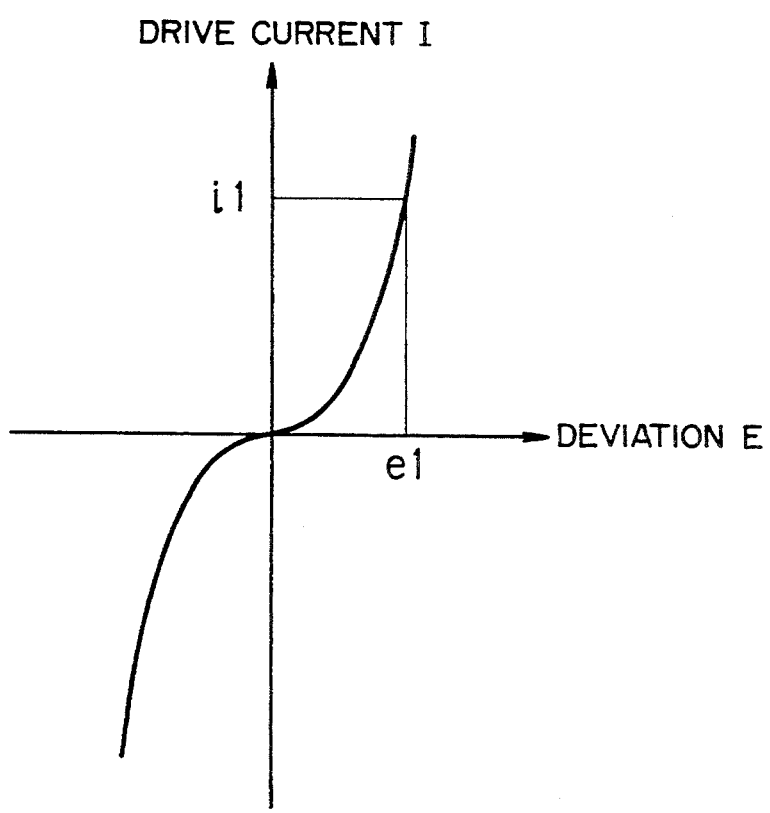
FIG. 8 is a graphic representation for showing a relationship between deviation and a drive current in the drive circuit of the conventional bonding apparatus.

Referring now to FIG. 5, this drive circuit 35 will be explained.

In this drawing, reference numeral 35a shows a position control means for inputting therein the deviation "E" obtained from the calculator 34 and for outputting a velocity instruction; reference numeral 35b indicates a feedback signal processing circuit for outputting a velocity feedback signal representative of velocity of the tool 2 by differentiation processing of the feedback signal B; and reference numeral 35c denotes a velocity control means for receiving the velocity instruction and the velocity feedback signal, and for outputting a current value, as a current instruction, required to drive the motor 12 so as to obtain a coincidence of the received signals. Furthermore, reference numeral 35d shows a switch for selectively switching the position control method and the torque control method in response to the control switching signal C. When this switch 35d is connected to the velocity control means 35c, the position control method is selected for the drive circuit 35. When this switch 35d is connected to the control means 33, the torque control method is selected for the drive circuit 35.

The switching operation of this switch 35d is performed in response to the control changing signal C issued from the control means 33.

In this drawing, reference numeral 35e indicates a current control means which outputs a current determined based on the current instruction transmitted from the velocity control circuit 35c when the position control method is selected in the drive circuit 35. To the contrary, when the torque control method is selected, this current control means 35e outputs a current in accordance with a pressure applying instruction signal "D" derived from the control means 33. Then, this current is amplified by a power amplifier 35f and the amplified current is supplied as a drive current "I" to the motor 12. Gain characteristics of the position control circuit 35a and the velocity control circuit 35c are selectable as either a high gain characteristic "K1", or a low gain characteristic "K2". The selection of these gain characteristics may be carried out in response to a gain changing signal "F" transmitted from the control means 33. It should be noted that the selection between the high gain characteristic and the low gain characteristic may be realized for only one of these position control circuit 35a and velocity control circuit 35c.

Figure 3:
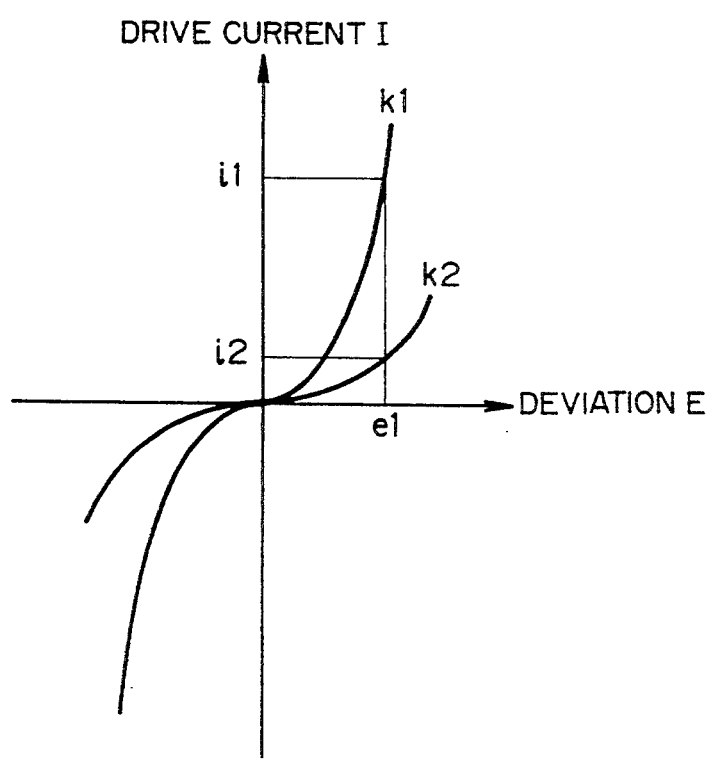
FIG. 3 is a graphic representation of a relationship between deviation and a drive current in a drive circuit of the bonding apparatus according to the embodiment of the present invention.

FIG. 3 graphically represents a relationship between deviation and a drive current in the drive circuit 35. As to the high gain characteristic K1, when a value of the deviation "E" is "e1", a value of the drive current I becomes "i1". With regard to the low gain characteristic K2, a value of the drive current I becomes "i2" smaller than "i1" under such a condition that the value of the deviation "E" is "e1".

In other words, when the gain is increased, the drive circuit 35 sensitively responds to very small deviation "E", so that the drive current I is supplied to the motor 12. Thus the capillary tool 2 is moved at a velocity in approximate proportion to magnitude of the drive current I.

Figure 2:
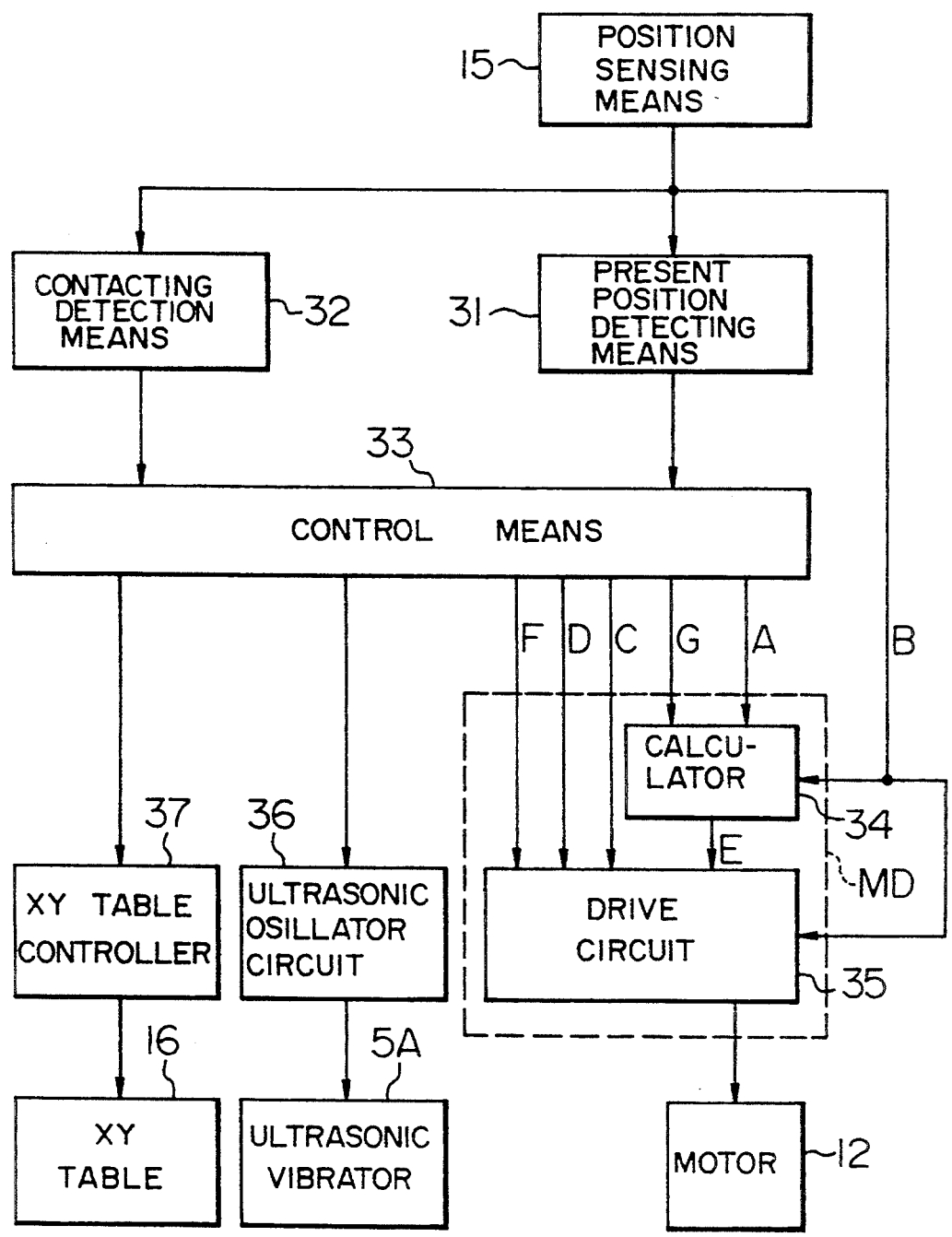
FIG. 2 is a schematic block diagram of the bonding apparatus according to the embodiment of the present invention.

In FIG. 2, reference numeral 36 denotes an ultrasonic oscillator circuit which ultrasonically drives the ultrasonic vibrator 5A mounted on the horn 1A when a signal is sent from the control means 33. Reference numeral 37 shows an XY table controller for driving an XY table 16 to transport the capillary tool 2A to a desired position. This operation is carried out based on data stored in the control means 33.

A description will now be made of the wire bonding apparatus according to this embodiment with reference to FIG. 4A.

Figure 4A:
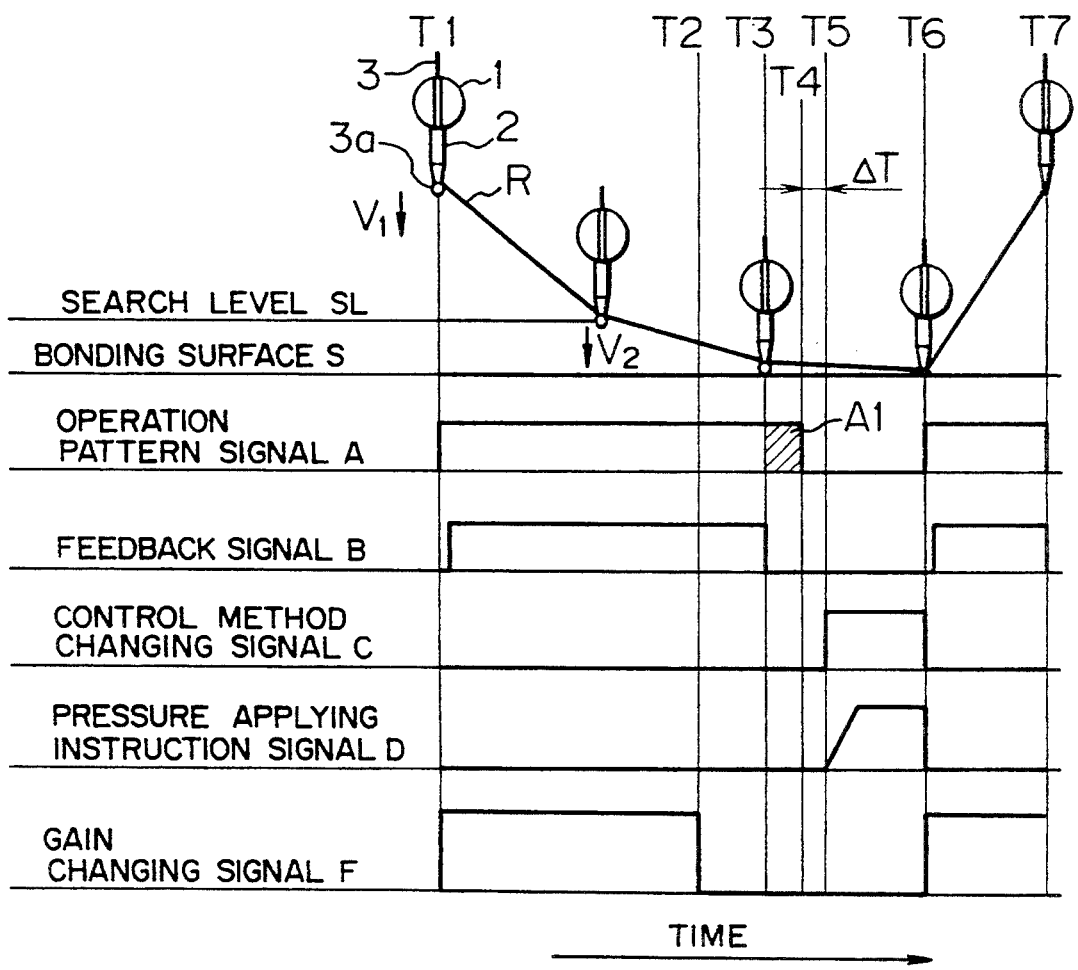
FIG. 4A is a timing chart for representing a control method of the bonding apparatus according to the embodiment of the present invention.

At a time instant T1 shown in FIG. 4A, the drive circuit 35 is set to the position control method, and also the gain characteristic thereof is set to the high gain characteristic K1 (refer to FIG. 3).

First, a ball 3a is formed at the lower edge portion of the wire 3 by way the torch rod 19 at the time instant T1. Thereafter, the operation pattern signal "A" is sent from the control means 33 to the motor driver MD, whereby the capillary tool 2A is caused to descend up to a search level "SL" at a high speed V1, and to further descend from this search level "SL" at a low speed V2 under constant velocity.

Subsequently, the present high gain characteristic is changed to the low gain characteristic at a time instant T2 for preparing that the ball 3a is contacted to the bonding plane "S".

The changing operation of the gain characteristic is carried out at a time instant when the present position (height) outputted from the present position counter 31 reaches a present value during the actual bonding operation, while the height of the capillary tool 2a at the gain changing time instant has been previously stored in the memory of the control means 33.

As a consequence, when the capillary tool 2A is further moved downward at the low speed V2, and the ball 3a is in contact with the bonding plane "S" at a time instant T3, the descending speed of the capillary tool 2A is rapidly lowered.

Next, at a time instant T4 slightly elapsed from the above time instant T3, when the contact detecting circuit 32 detects such a fact that the ball 3a is in contact with the bonding surface, or plane S, the control means 33 transmits the reset signal "G" to the calculator 34 so as to set the value of deviation "E" to zero at the same time when the transmission of the operation pattern signal "A" is interrupted, or stopped.

During a time period from the time instant T3 to the time instant T4, since the control means 33 does not recognize contact of the ball 3a to the bonding surface "S", the control means continues to send the operation pattern signal "A" to the drive circuit 35. The descending speed of the capillary tool 2A is reduced to such a speed near 0. As a consequence, although the value of the deviation E between the operation pattern signal "A" and the feedback signal "B" is rapidly increased to the value "e1" during the time period between the time instant T3 and the time instant T4, since the low gain characteristic K2 is previously selected as the gain characteristic, the drive current I outputted from the drive circuit 35 is increased only up to "i2", so that it is possible to prevent that excessive impact loads are given to the ball 3a and the bonding surface (see FIG. 3). Next, at a time instant T5 after time "ΔT" has elapsed from the time instant T4, the control method changing signal "F" is supplied from the control means 33 to the drive circuit 35 in order that the control method is changed into the torque control method. At the same time, the pressure applying instruction signal "D" is transmitted from the control means 33 to the drive circuit 35, whereby a predetermined bonding load is given to the ball 3a, and also ultrasonic waves are applied to the ball 3a so as to be in contact with the bonding surface "S".

The reason why the position control method is changed into the torque control method after time of "ΔT" has elapsed since a detection was made of contacting of the ball 3a, is given as follows: That is, it is prevented that the capillary tool 2A will jump due to reaction force exerted from either the bonding surface S, or the ball 3a when the ball 3A is contacted. Otherwise, inertial movements of movable portions such as the horn 1 and the motor 1 are prevented.

It is preferable to apply a bonding load to the ball 3a while this bonding load is gradually increased from 0 to a preselected value.

After the ball 3a is connected to the bonding surface S to complete the first bonding operation at a time instant T6, the capillary tool 2A is elevated at a high speed while the wire is derived from the tip portion of the capillary tool 2A. Then, the capillary tool 2A is transported to such a position where a second bonding operation is performed, and then the second bonding operation is carried out. It should be noted that the second bonding operation is executed in a similar manner to the above-described first bonding operation.

Figure 4B:
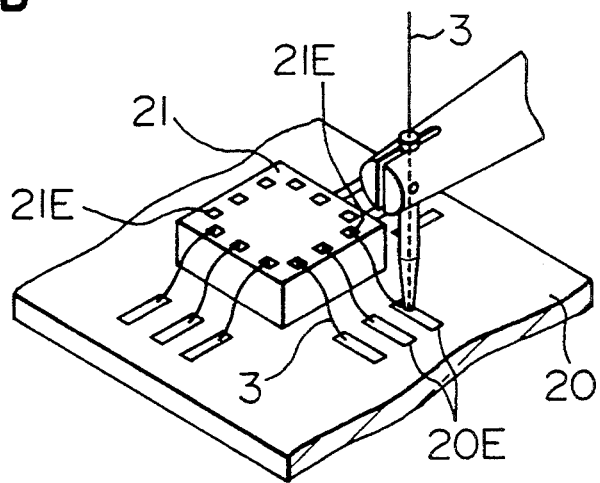
FIG. 4B is a schematic partial view of a capillary tool example used in a wire bonding.

The wire bonding between the semiconductor chip 21 and the substrate 20 is carried out by repeating a series of the above-explained operations. FIG. 4B schematically shows a tool example carrying out a wire bonding of terminals 20E of a substrate 20 and semiconductor chip terminals 21E.

Figure 4C:
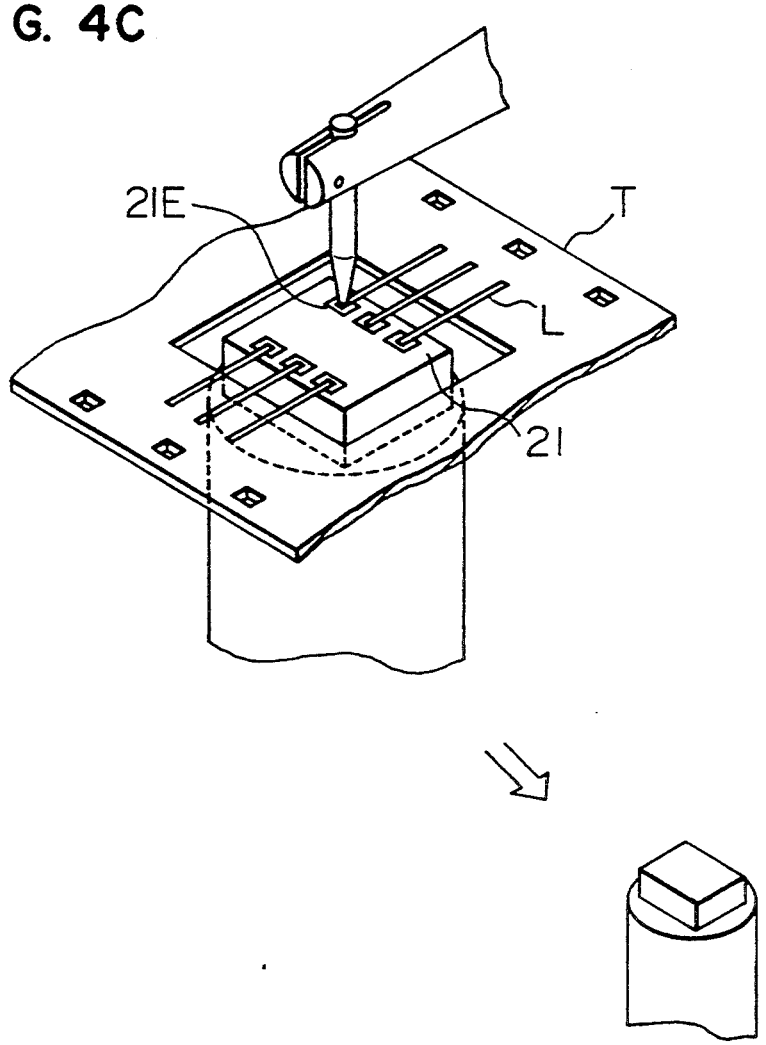
FIG. 4C is a similar view of a solid tool example used in an inner lead bonding.

The present invention may be also applied to such an inner lead bonding other than the wire bonding, in which leads formed on a carrier tape bonded and connected to electrodes or terminals of a semiconductor chip. In this case, a pressing tool made of a solid tool is fixed to the tip portion of the horn, instead of the capillary tool made of a hollow body, and this pressing tool is contacted onto the leads to carry out the bonding operation under such a condition that the leads are positioned to the upper surface of the terminals of the semiconductor chip. FIG. 4C schematically shows a solid tool used for an inner lead bonding wherein thin leads L provided on a carrier tape T are superposed respectively on terminals of a semiconductor chip 21 supported in an opening formed in the carrier tape and supported by a stage S, and the solid tool is put in pressure contact on and with the superposed lead surface portions to apply heat or ultrasonic energy, thereby bonding them together. In the inner lead bonding, the essential feature of the present invention, i.e., the control of the down motion of the arm and solid tool also ensures various advantages such as mentioned above with the wire bonding. In other words the wire bonding is effected under the control by using the capillary tool for holding the gold wire by its inner hole or channel through which the wire is passed, and the inner lead bonding is effected under the same or like control by using a solid tool for applying heat and pressure for the bonding instead of the capillary tool. Thus the inner lead bonding method differs substantially in the used tool and related bonding operation from the wire bonding method, but the two methods can provide the same or like advantages in the respective tool moving or driving operations according to the present invention.

What is claimed is:

1. A bonding apparatus comprising:
   holding means for holding an object to be bonded;
   supporting means for mounting thereto said holding means;
   driving means for moving upwardly and downwardly said supporting means;
   a drive control circuit for controlling said drive means in accordance with stored information about operations of said supporting means; and
   control means for changing a gain characteristic of said drive control circuit from a high gain characteristic to a low gain characteristic while said holding means is driven to descend before said holding means is contacted onto a bonding surface.

2. A bonding apparatus as claimed in claim 1, wherein said supporting means is mounted on transport means reciprocated along a predetermined straight line.

3. A bonding apparatus as claimed in claim 2, wherein said control means includes a position detecting means for detecting a height of said holding means, and changes the gain characteristic of said drive control circuit from the high gain characteristic to the low gain characteristic when said position detecting means detects that said holding means has moved from the bonding surface to a predetermined height above.

4. A bonding apparatus as claimed in claim 1, wherein said control means includes a contact detecting means for detecting that said holding means is contacted onto the bonding surface, and changes the gain characteristic of said drive control circuit while said holding means is driven to descend before said holding means is contacted onto the bonding surface.

5. A bonding apparatus as claimed in claim 4, wherein when said contact detecting means detects that said holding means has reached onto the bonding surface, said storage means has information about operations of said supporting means for applying a predetermined bonding load to the bonding surface by said control means.

6. A bonding method for a bonding apparatus comprising
holding means for holding a first object to be bonded; supporting means for supporting said holding means; driving means for moving upwardly and downwardly said supporting means; a drive control circuit for controlling said drive means in accordance with stored information about operations of said supporting means; and control means for changing a gain characteristic of said drive control circuit from the high gain characteristic to the low gain characteristic, said first object held by said holding means being bonded to a second object to be connected wherein;
said bonding method comprises:
a first step of causing said supporting means to descend by operating said driving means under such a condition that said drive control circuit is under a high gain state; and
a second step of causing said supporting means to descend by operating said driving means under a low gain state before said holding means is contacted onto a bonding surface.

7. A bonding method as claimed in claim 6, further comprising:
a third step subsequent to said second step and applying a bonding load to the bonding surface by said holding means after said holding means has been contacted to the bonding surface.

8. A bonding apparatus for bonding an object to a bonding surface, comprising:
a bonding arm having one end portion having a bonding tool attached thereto;
a motor for moving up and down said arm together with said bonding tool to said bonding surface;
a drive circuit having a variable gain for driving said motor;
position detection means for generating a signal representative of height position of said tool in direction of up and down motion of said tool;
contact detection means for generating a signal representative of the contact of said tool to said bonding surface;
a control circuit for changing the gain of said drive circuit before the generation of the contact representative signal of said contact detection means.

9. A bonding apparatus of claim 8, wherein said control circuit is adapted to change the gain of said drive circuit from a high gain to a low gain in response to a height position signal generated by said position detection means near a predetermined height from said bonding surface.

10. A bonding apparatus of claim 8, wherein said object is a gold wire, and said bonding tool is a capillary tool having an inner channel for causing portion of the gold wire to pass therethrough.

11. A bonding apparatus of claim 8, wherein said object is a lead provided on a carrier tape, and said bonding tool is a solid pressing tool.

12. A bonding apparatus of claim 8, wherein said control circuit is adapted to control said drive circuit for application of a bonding pressure to said bonding surface in response to the contact representative signal generated by said contact detection means.

13. A bonding apparatus of claim 12, wherein said control circuit is adapted to control said drive circuit for causing the application of the bonding pressure to said bonding surface at a predetermined time after generation of the contact representative signal generated by said contact detection means.

14. A bonding method for bonding an object to a bonding surface by a bonding tool attached to one end portion of a horn to be moved upwardly and downwardly by motor, a motor drive circuit and a drive control circuit, said method comprising the steps of:
moving said bonding tool together with said horn to said bonding surface;
changing a gain of said drive circuit from a high gain to a low gain just before said bonding tool contacts to said bonding surface; and
applying a bonding pressure to said bonding surface by said bonding tool after the contact of said bonding tool.

15. An inner lead bonding apparatus for bonding leads provided on a carrier tape to terminal surfaces of a semiconductor chip, comprising:
a bonding arm having one end portion and a solid pressing tool attached to said end portion;
a motor and drive circuit having a variable gain for moving said pressing tool together with said bonding arm upwardly and downwardly;
control means for controlling said drive circuit for control of the moving operation of said motor;
height signal generation means for generating a feedback signal of height position of said pressing tool in direction of up and down motion of said pressing tool and in response to motion of said motor; and
means for changing the gain of said drive circuit from a high gain to a low gain in response to a signal representative of a predetermined height generated by said height signal generation means.

16. A wire bonding apparatus for bonding wire to terminal surface portions comprising:
a bonding arm having one end portion and a capillary tool attached to said end portion and having an inner channel for causing portion of the wire to pass therethrough;
a motor and drive circuit having a variable gain for moving said capillary tool together with said bonding arm upwardly and downwardly;
control means for controlling said drive circuit for control of the moving operation of said motor;
height signal generation means for generating a feedback signal of height position of said capillary tool in direction of up and down motion of said tool and in response to motion of said motor;
contact detection means for generating a signal representative of contact of said tool to said terminal surface; and
means for changing the gain of said drive circuit from a high gain to a low gain in response to a signal representative of a predetermined height generated by said height signal generation means before the generation of said signal of the contact of said tool.

17. A wire bonding apparatus of claim 16, wherein said control means includes memory means storing an operation pattern for changing operation speed of said motor at least two times and storing a signal for changing the gain of said drive circuit in order to change said speed and said gain in response to said feedback signal of height position generated by said height signal generation means; and said apparatus includes:

position control means for generating a first speed-control signal in response to said operation pattern signal and said feedback signal generated by said height signal generation means;

means for generating a second speed-control signal in response to said feedback signal;

speed control means for generating a motor speed control signal in response to said first and second speed-control signals; and switching means for changing gain of at least one of said position control means and said speed control means in response to the gain changing signal stored in said memory means.

* * * * *